United States Patent
Molson et al.

(10) Patent No.: US 7,509,246 B1
(45) Date of Patent: Mar. 24, 2009

(54) SYSTEM LEVEL SIMULATION MODELS FOR HARDWARE MODULES

(75) Inventors: Philippe Molson, San Jose, CA (US); Tony San, Sunnyvale, CA (US); Jeffrey R. Fox, Los Gatos, CA (US)

(73) Assignee: Altera Corporation, San Jose, CA (US)

( * ) Notice: Subject to any disclaimer, the term of this patent is extended or adjusted under 35 U.S.C. 154(b) by 396 days.

(21) Appl. No.: 10/458,516

(22) Filed: Jun. 9, 2003

(51) Int. Cl.
*G06F 17/50* (2006.01)

(52) U.S. Cl. .................. 703/13; 717/135; 717/140

(58) Field of Classification Search ............ 703/13; 717/135, 140
See application file for complete search history.

(56) References Cited

U.S. PATENT DOCUMENTS

| | | | |
|---|---|---|---|
| 5,204,829 A | | 4/1993 | Lyu et al. |
| 5,452,239 A | * | 9/1995 | Dai et al. ............... 703/19 |
| 5,544,067 A | * | 8/1996 | Rostoker et al. ............ 703/14 |
| 5,726,902 A | * | 3/1998 | Mahmood et al. ............ 716/6 |
| 5,848,262 A | | 12/1998 | Burch |
| 6,053,947 A | | 4/2000 | Parson |
| 6,067,650 A | * | 5/2000 | Beausang et al. ........... 714/726 |
| 6,086,624 A | | 7/2000 | Murata |
| 6,152,612 A | * | 11/2000 | Liao et al. ............... 703/23 |
| 6,182,247 B1 | | 1/2001 | Herrmann et al. |
| 6,247,147 B1 | | 6/2001 | Beenstra et al. |
| 6,247,165 B1 | * | 6/2001 | Wohl et al. ............... 716/5 |
| 6,286,114 B1 | | 9/2001 | Veenstra et al. |
| 6,389,558 B1 | | 5/2002 | Hermann et al. |
| 6,425,116 B1 | | 7/2002 | Duboc et al. |
| 6,460,148 B2 | | 10/2002 | Veenstra et al. |
| 6,530,073 B2 | * | 3/2003 | Morgan ............... 716/18 |
| 6,539,536 B1 | * | 3/2003 | Singh et al. ............... 716/18 |
| 6,606,532 B1 | | 8/2003 | Yasuura et al. |
| 6,606,588 B1 | | 8/2003 | Schaumont et al. |
| 6,687,662 B1 | | 2/2004 | McNamara et al. |
| 6,789,232 B1 | * | 9/2004 | Iyer et al. ............... 716/1 |
| 6,842,888 B2 | * | 1/2005 | Roberts ............... 716/18 |
| 6,862,563 B1 | | 3/2005 | Hakewill et al. |

(Continued)

OTHER PUBLICATIONS

Pelkonen et al. ( system-Level Modeling of Dynamically Reconfigurable Hardware with SystemC, EE 2003).*

(Continued)

*Primary Examiner*—Paul L Rodriguez
*Assistant Examiner*—Andre Pierre Louis
(74) *Attorney, Agent, or Firm*—Weaver Austin Villeneuve Sampson LLP

(57) ABSTRACT

Methods and apparatus automate creation of code for system level simulations from hardware representations, specifically RTL representations. In one approach, individual RTL hardware modules are analyzed to generate code for corresponding system level modules. This is accomplished by taking a mapped netlist for a register transfer level (RTL) representation of the hardware module and converting it to what can be termed a "system level netlist." This system level netlist contains "system level instances" corresponding to "hardware cells" of the mapped netlist. A mapped netlist includes hardware cells corresponding to programmed hardware units of a target hardware device. The method generates corresponding functional representations (code for system level simulation) from these hardware cells. This functional representation is referred to herein as a system level instance. System level instances are generated for each of the hardware cells in a given hardware module.

22 Claims, 9 Drawing Sheets

U.S. PATENT DOCUMENTS

| | | | |
|---|---|---|---|
| 6,883,147 | B1 | 4/2005 | Ballagh et al. |
| 6,915,410 | B2* | 7/2005 | Hyduke .................. 712/17 |
| 7,020,854 | B2 | 3/2006 | Killian et al. |
| 7,085,702 | B1 | 8/2006 | Hwang et al. |
| 7,107,567 | B1 | 9/2006 | LeBlanc |
| 7,110,935 | B1 | 9/2006 | Hwang et al. |
| 2002/0049944 | A1 | 4/2002 | Lagoon et al. |
| 2002/0194543 | A1 | 12/2002 | Veenstra et al. |
| 2003/0008684 | A1 | 1/2003 | Ferris ..................... 455/561 |
| 2003/0033374 | A1 | 2/2003 | Horn et al. |
| 2003/0088710 | A1 | 5/2003 | Sandhu et al. |
| 2003/0118081 | A1 | 6/2003 | Horn et al. .............. 709/217 |
| 2003/0125925 | A1* | 7/2003 | Walther et al. ............ 703/22 |
| 2003/0154465 | A1 | 8/2003 | Bollano et al. |
| 2003/0200522 | A1* | 10/2003 | Roberts .................. 716/18 |
| 2003/0204388 | A1* | 10/2003 | Rodriguez et al. ......... 703/14 |
| 2004/0093197 | A1* | 5/2004 | Billemaz et al. .......... 703/13 |
| 2005/0065990 | A1 | 3/2005 | Allen |
| 2005/0143968 | A9 | 6/2005 | Odom et al. .............. 703/21 |
| 2005/0166038 | A1 | 7/2005 | Wang et al. |
| 2006/0117274 | A1* | 6/2006 | Tseng et al. .............. 716/1 |

OTHER PUBLICATIONS

Givargis et al. (Instruction-Based System-Level Power Evaluation of System-on-a-Chip Peripheral Cores, IEEE 2002).*

Grant Carter, System Level Simulation of Digital Designs: A Case Study, 1998.*

Description of DSP design from the Math Works website (www.mathworks.com/products/dsp-comm/topdown.shtml); available prior to May 31, 2002.

Description of Xilinx System Generator for Simulink; Product and Description available prior to May 31, 2002.

Description of DSP Builder product available from Altera Corporation; description appears at www.altera.com/products/software/system/dsp/dsp-builder.html; available prior to May 31, 2002.

Altera DSP Builder User Guide; available prior to May 31, 2002.

Simulink Fixed-Point Blockset, User's Guide, Version 3; Product and Description available prior to May 31, 2002.

Molson et al., "Bit Accurate Hardware Simulation in System Level Simulators," U.S. Appl. No. 10/160,142, filed May 31, 2002, 51 Pages.

S. Mahlke, R. Ravindran, M. Schlansker, R. Schreiber, and T. Sherwood, "Bitwidth Cognizant Architecture Synthesis of Custom Hardware Accelerators", herein referred as Sherwood, 5$^{th}$ International Workshop on Software and Compilers for Embedded Systems, Mar. 2001 IEEE, total pages of 43.

Per Holmberg, and Anne Mascarin, "The Meth Works and Xilnx take FPGAs into Mainstream DSP", New Techologies DSP, Feb. 2001, pp. 14-15.

Christian Kreiner, Christian Steger, Egon Teiniker, and Reinhold Weiss, "A Novel Codesign Approach based on Distributed Virtual Machines", Institute for Technical Informatics, Mar. 2002.

Darin Chin, "Implementing DSP Designs with the Xilnx System Generator and Implementation Tools", Jun. 2001, Syndicated, vol. 1, Issue 2, pp. 1-2.

Xilnx® "ChipScope Pro Software and Cores User Manual", Apr. 10, 2002.

"Simulink: Dynamic System Simulation for MATLAB®" Verson 3. Jan. 1999.

"Formal Verification Flow for Xilinx Devices Using the Synplify Pro® Software and Conformal™ LEC Tool", Mar. 2003. http://www.synplicity.com/literature/pdf/formal_verificat4ion_final.pdf.

* cited by examiner

SYSTEM LEVEL SIMULATION MODELS FOR HARDWARE MODULES

CROSS REFERENCE TO RELATED APPLICATIONS

This application is related to U.S. patent application Ser. No. 10/160,142, filed May 31, 2002 by P. Molson and T. San, and titled "BIT ACCURATE HARDWARE SIMULATION IN SYSTEM LEVEL SIMULATORS."

AUTHORIZATION

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The present invention relates to methods and apparatus for developing hardware modules that can be used in system level simulations. More specifically, the present invention relates to methods and apparatus for automating the generation of system level simulation hardware modules from Register Transfer Language (RTL) representations of the modules.

Simulink® (available from The MathWorks, Inc. of Natick, Mass.) and similar system level simulators allow users to enter and simulate logic designs representing Digital Signal Processors (DSPs) and other electronic devices. The logic designs are algorithmic representations. Users design DSP algorithms in system level simulators by entering logic blocks and associated connections in a user interface window representing the overall design. The individual logic blocks come with associated code for executing the functions of the blocks. During a system level simulation, the simulator executes the code for each individual block to provide a simulation result; Typically, the code is written in C++ or other appropriate compilable language.

Frequently, the logic blocks used to create hardware designs are available in libraries of pre-created modules. However, these modules are typically limited to algorithm level representations (as opposed to hardware level representations). Thus, they represent logic by function or behavior only, not by hardware operation.

On a somewhat different historical path, many specific hardware modules are available in libraries for electronic design automation. These modules are intended to facilitate hardware design, compilation, simulation, and programming using conventional Electronic Design Automation (EDA) tools such as gate level synthesizers and compilers (e.g., the Quartus® II design tool available from Altera Corporation of San Jose, Calif.). Designs created from such modules can be simulated to give results that accurately predict the performance of the final hardware implementation. But the EDA environments that make use of such modules lack many popular features of system level simulators such as Simulink.

Recently, a few companies have introduced system level simulation products that provide some measure of hardware simulation. These include the "DSP Builder" product from Altera Corporation, the "System Generator for Simulink" available from Xilinx, Inc. of San Jose, Calif., and the "Simulink RTW" tools available from The MathWorks, Inc. These products allow bit and cycle accurate system level simulation of hardware designs. Hence there is a movement toward merging the functionality of conventional system level simulators and conventional EDA tools for hardware development.

While the available hardware modules for EDA tools come in many different forms, they generally include a register transfer level description of the hardware logic for their modules. From this RTL description, the EDA tools, can elaborate, synthesize, simulate, etc. Some of these hardware modules include pre-synthesized gate level logic and even pre-compiled logic.

What most of these modules lack, however, is code for implementing their functions in a system level simulator such as Simulink. Yet, as mentioned, products such as the DSP Builder product from Altera Corporation allow entry of hardware modules in system level simulators. As these products become more widely deployed and available for designing and simulating true hardware (as opposed to merely algorithms for subsequent implementation in hardware), the large base of hardware modules must be provided with simulation code (e.g., C++ code) for execution in system level simulators.

In short, current libraries of hardware modules having appropriate system level simulation representations are severely limited. The large libraries of hardware modules that exist represent hardware only in RTL description (and sometimes in a synthesized, compiled form), but not in a C++ functional description suitable for system level simulation.

Thus, the EDA industry needs some mechanism for providing the large existing base of hardware modules with code for executing their logical or functional operations in system level simulators. Unfortunately, coding appropriate system level representations of hardware modules for system level simulation represents significant additional effort on the part of the module designer. And the problem is not limited to vendors and developers of hardware modules. It extends to individual designers or companies employing designers, who need to conduct a system level simulation but do not have libraries of hardware modules (whether developed in-house or purchased elsewhere) that comprise code for system level simulation. For all of these people and organizations, this remains a significant obstacle to deploying existing hardware modules in system level simulators. Hence the potential of system level simulators for EDA remains unrealized.

SUMMARY

The present invention addresses this problem by providing apparatus and methods that automate creation of code for system level simulations from hardware representations, specifically RTL representations. In one approach, individual RTL hardware modules are analyzed to generate code for corresponding system level modules. Basically, the invention provides "system level" versions of hardware design blocks from RTL (Register Transfer Level) representations of those blocks. It accomplishes this by taking a mapped netlist for a register transfer level (RTL) representation of the hardware module and converting it to what can be termed a "system level netlist." This system level netlist contains "system level instances" corresponding to "hardware cells" of the mapped netlist. A mapped netlist, which may be generated in typical electronic design automation, includes hardware cells corresponding to programmed hardware units of a target hardware device. For example, a multiplier/accumulator logic combination from a netlist may be mapped to a particular SRAM or look up table logic element of a target hardware device and a block of RAM in the same netlist may be mapped to a memory element of a target device. The portions of the netlist mapped to hardware logic elements, memory elements, etc. are referred to herein as hardware cells. The present invention generates corresponding functional representations (code for system level simulation) from these hardware cells. The functional representations are referred to herein as system level instances. System level instances are generated for each of the hardware cells in a given hardware module.

The system level instances are generated by instantiating system level classes, which correspond to the various types of hardware units that are available on a target hardware device: e.g., logic elements, memory elements, and registers. Instantiation may involve parameterizing the system level classes with ports, logic functions, etc.

One aspect of this invention pertains to a method of generating a system level representation for a hardware module. The method may be characterized by the following sequence: (a) receiving a mapped netlist of a hardware module; (b) accessing one or more un-parameterized system level units corresponding to hardware units of a target hardware device; and (c) instantiating the un-parameterized system level units to create system level instances, each programmed to perform the hardware functions of a corresponding hardware cell. Together, the system level instances comprise a system level netlist. The mapped netlist comprises hardware cells, each specifying one or more hardware functions to be implemented on a corresponding hardware unit of a target hardware device. Examples of the hardware units include logic elements, memory elements, and register elements, each of which define a fundamental architectural unit on the target hardware device.

The mapped netlist may be generated by methods of this invention. In one embodiment, the mapped netlist is generated by the following sequence of operations: (i) receiving a register transfer level (RTL) representation of the hardware module; (ii) elaborating the RTL representation to produce a netlist; and (iii) mapping the netlist to hardware units of a target hardware device, on which the hardware module may be programmed, to create hardware cells. This method may additionally require synthesizing the netlist generated at (ii). Preferably, the hardware modules used to generate the system level representations retain their original RTL representations, as the RTL representations are necessary in order to synthesize, compile, and ultimately program the design onto a target hardware device.

In certain embodiments, the un-parameterized system level units are C++ classes. They may be instantiated by specifying ports and logical functions for the un-parameterized system level units. To perform a system level simulation, the method may additionally compile the system level netlist to produce an executable version of the system level representation.

Yet another aspect of the invention pertains to apparatus and computer program products including machine-readable media on which are provided program instructions and/or arrangements of data for implementing the methods and software systems described above. Frequently, the program instructions are provided as code for performing certain method operations. Data, if employed to implement features of this invention, may be provided as data structures, data objects, or other appropriate arrangements of stored information. Any of the methods or systems of this invention may be represented, in whole or in part, as such program instructions and/or data provided on machine-readable media.

These and other features and advantages of the present invention will be described in more detail below, with reference to the appended drawings.

DETAILED DESCRIPTION

Introduction

Figure 1A:
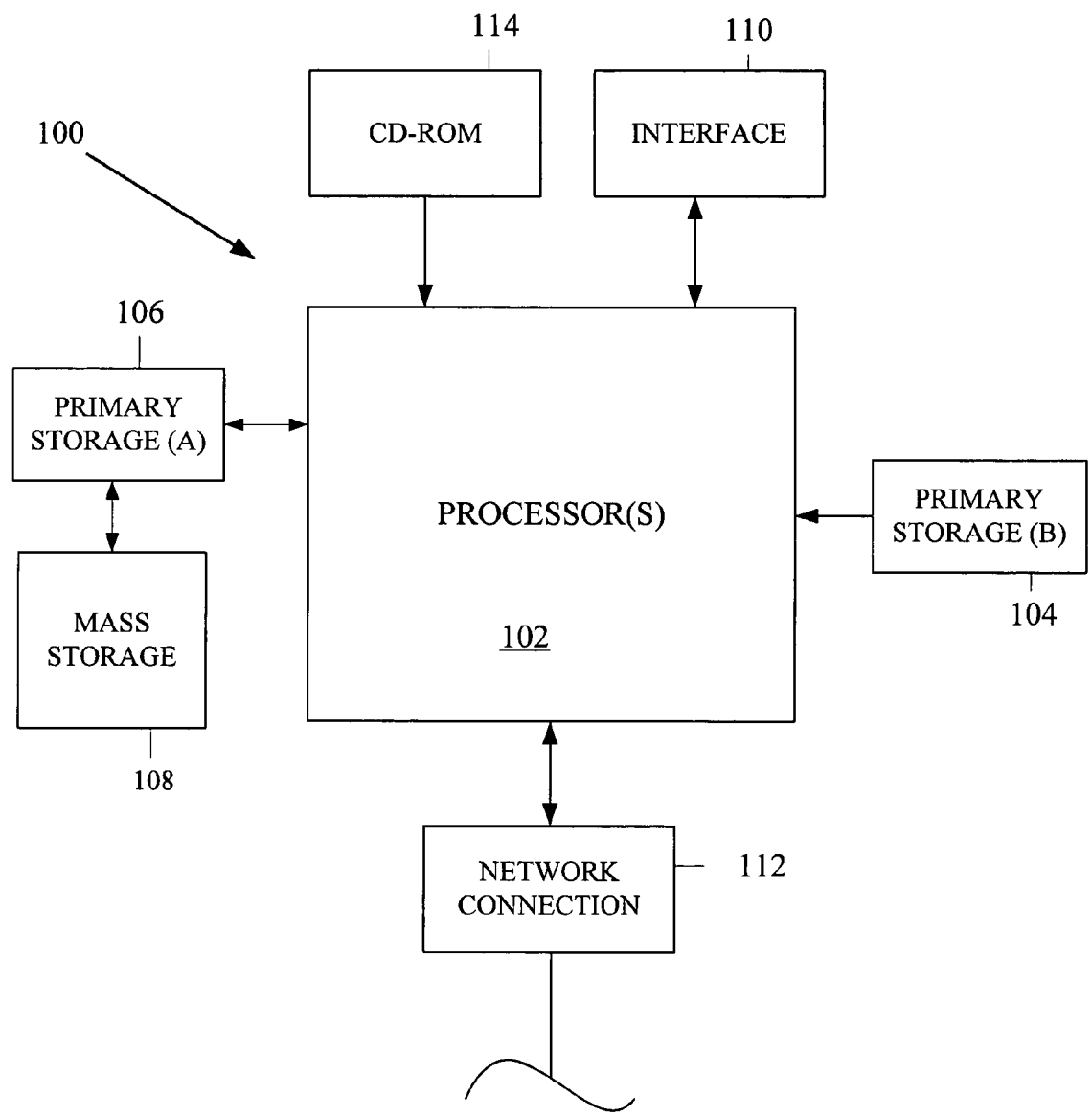
FIG. 1A illustrates a typical computer system that, when appropriately configured or designed, can serve as an apparatus of this invention.

Generally, this invention pertains to methods of generating system level representations for hardware modules. A "hardware module" is any hardware functional block such as a megafunction, a core, a macrofunction, and simpler functional blocks such as adders, multipliers, buffers, and multiplexers. Sometimes a hardware module is referred to as a "functional block" or a "hardware block." It is generally coded in a Hardware Design Language or Register Transfer Language. A corresponding "system level representation" is a programmed function for simulating all functions (or the entire function) implemented by the hardware module.

It is important to understand the distinction between an RTL hardware representation and a system level representation. A system level representation is a functional representation usually coded in a general-purpose language such as C++ for execution on a general-purpose microprocessor such as a Pentium® III processor from Intel Corporation of San Jose, Calif. It is not tied to any particular hardware implementation. An RTL representation is usually coded in a special purpose Hardware Design Language such as VHDL or Verilog. When such code is provided as input to an EDA tool, it is typically elaborated to produce a netlist, which may be "compiled" (in an EDA sense) to produce instructions for "programming" a PLD with various hardware functions implementing the hardware device. Thus, the RTL and system level representations have different coding and different uses. But both may represent the same hardware design.

In embodiments of this invention, the system level representation is generated by viewing the hardware module from a lower level—the level of a mapped netlist. A netlist comprises memory and logic elements connected by nets. During mapping, the netlist for a hardware module is divided into units, so that every net and logic or memory component of the hardware module is included in a particular unit. A netlist grouped in this manner is referred to as a mapped netlist. To create the system level representation, a generator of this invention creates a system level instance for each unit of the mapped netlist. The system level instance is code for performing (simulating) the functions contained within the unit. Generally, though not necessarily, the units of the mapped netlist correspond to hardware units on a target hardware device. For example, such units might correspond to the amount of logic that can be implemented on a single logic element of a target hardware device.

From the above discussion, the meanings of certain relevant terms should be reasonably clear. However, to further illuminate certain concepts pertinent to this invention, the following definitions are provided. These definitions are provided to assist in understanding the concepts presented in the specification. They do not necessarily limit the scope of this invention.

The concept of a hardware module includes very simple modules comprising only a few gates on up to very complicated modules implemented as megafunctions. Some of the more complicated megafunctions code sophisticated filters, interfaces, and even processors. These products are available from various sources including vendors of such modules, companies that have developed their own in house proprietary modules, small working groups that reuse modules, and the like. Often, hardware modules are made available through a library of such modules. One example is the library of parameterized modules ("LPM") developed under the requirements of "EDIF" (Electronic Design Interchange Format) owned by the Electronic Industry Alliance (EIA). Examples of members of the library include adders, multipliers, comparators, etc.

During a typical design process, a designer creates an electronic design from various hardware modules. For example, the designer may first obtain a hardware module for a particular filter, then a module for a buffer, and then one for a memory block, and so on. With the component hardware modules in hand, the designer makes the necessary connections between them to create the larger design, a project.

A user simply inserts the hardware modules into his or her larger electronic design, makes the necessary connections to other features of the larger electronic design, and compiles the entire design per the normal procedure. The resulting compiled electronic design includes the off-the-shelf functional hardware modules integrated with other components of the design in a compiled form. This design can be then used to program a programmable logic device or layout an application specific integrated circuit (ASIC), for example. Such predefined off-the-shelf hardware modules are given various names in the EDA industry. Examples include megafunctions, cores, macrofunctions, and the like.

The term "electronic design" generically refers to the logical structure of an electronic device such as an integrated circuit. It may be implemented on hardware (usually referred to herein generically as a "target hardware device"). During the design and development effort, an electronic design may exist in various states or stages. It may be provided as a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

A "netlist" is used to describe the functionality of a digital circuit design that can be implemented on a programmable logic device or other target hardware device. The netlist is represented as hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc.

When in the form of a synthesized netlist, an electronic design may be divided into "logic cells" (sometimes called "hardware cells" herein) representing various logic functions within the electronic design. During compilation, these logic cells are mapped onto physical structures known as "logic elements" which reside on the target hardware device. The criteria for mapping gates into logic cells is that the resulting logic cell must be able to be put into one logic element. An example of a logic cell is a collection of gates (connected in some way and implemented in a look-up table) combined with a register and configured to implement a multiplexer.

The term "target hardware device" refers to a hardware device on which an electronic design is implemented. Examples include circuit boards and systems including multiple electronic devices and multi-chip modules, as well as integrated circuits. Specific examples of integrated circuits include traditional integrated circuits with full custom layouts, hardwired ASICs (e.g., gate arrays), and programmable ASICs such as Programmable Logic Devices (PLDs) including Field Programmable Gate Arrays (FPGAs) and Erasable Programmable Logic Devices (EPLDs). In the case of non-programmable integrated circuits such as gate arrays, the electronic design defines the arrangement of metal lines on one or more metallization layers of the target hardware device. In the case of programmable integrated circuits such as PLDs, the electronic design defines the gates as well as interconnects to be programmed on the target hardware device.

In the context of this invention, a target hardware device typically includes a plurality of logic elements which house logic cells from an electronic design in order to implement the logic functions specified by these cells. It may also include memory elements, registers, and/or dedicated functions such as processor cores and DSP blocks. The logic elements, memory elements, and registers are typically the fundamental elements of the hardware device's architecture on which different electronic design components can be defined. These elements may be grouped into blocks such that each discrete element is associated with a block (or other arbitrary containment entity). There may be higher-level organization in the device such that logic blocks are grouped into rows or some other arbitrary entity.

Generally, the term "simulator" refers to programs that can dynamically execute an abstract design description. Given a description of the circuit and a model for how the elements of the description behave, the simulator maps an input stimulus into an output response, often as a function of time. Simulators exist for all levels of design description, from the most abstract behavioral level through the detailed transistor level.

"System level simulators" allow entry of abstract process blocks (modules) representing various stages in an algorithm. The blocks themselves are not intrinsically linked to any particular hardware. Hence, in traditional system level simulators, the various modules comprising a design are not constrained to particular word formats, and the simulators simulate the various process blocks employing a full floating point representation of the input and output signals.

The Simulink product available from The MathWorks, Inc. is a widely used system level simulator. Throughout this specification, Simulink is used as an example. However, this invention is not limited to Simulink or any other commercial or proprietary system level simulator. Further, the invention applies to both enhancements of existing simulator products (such as Simulink) and completely new simulator products designed from the ground up. Generally, though not necessarily, system level simulators are implemented as software running on a general-purpose microprocessor. Simulink, for example, is a software application that can run on Intel Pentium® processors. And generally, though not necessarily, full floating point notation is the default representation of process blocks in system level simulators.

Apparatus and Environment

Before describing method embodiments of the invention, this section will present some general features of pertinent apparatus. Generally, embodiments of the present invention employ various processes or methods involving data stored in or transferred through one or more computing devices. Embodiments of the present invention also relate to an apparatus for performing these operations. Such apparatus may be specially constructed to serve as a simulation module generator or design environment, or it may be a general-purpose computer selectively activated or reconfigured by a computer program and/or data structure stored in the computer. The processes presented herein are not intrinsically related to any particular computer or other apparatus. Various general-purpose machines may be used with programs written in accordance with the teachings herein, or it may be more convenient to construct a more specialized apparatus to perform the required method operations. A particular structure generally representing a variety of these machines will be described below.

In addition, embodiments of the present invention relate to computer readable media or computer program products that include program instructions and/or data (including data structures) for performing various computer-implemented operations associated with generating and using system level representations of hardware modules. Examples of computer-readable media include, but are not limited to, magnetic media such as hard disks, floppy disks, and magnetic tape; optical media such as CD-ROM disks; magneto-optical media; semiconductor memory devices, and hardware devices that are specially configured to store and perform program instructions, such as read-only memory devices (ROM) and random access memory (RAM). The data and program instructions of this invention may also be embodied on a carrier wave or other transport medium (including electronic or optically conductive pathways).

Examples of program instructions include low-level code, such as that produced by a compiler, as well as higher-level code that may be executed by the computer using an interpreter. Further, the program instructions may be machine code, source code and/or any other code that directly or indirectly controls operation of a computing machine in accordance with this invention. The code may specify input, output, calculations, conditionals, branches, iterative loops, etc.

FIG. 1A illustrates, in simple block format, a typical computer system that, when appropriately configured or designed, can serve as a computational apparatus of this invention. The computer system 100 includes any number of processors 102 (also referred to as central processing units, or CPUs) that are coupled to storage devices including primary storage 106 (typically a random access memory, or RAM), primary storage 104 (typically a read only memory, or ROM). CPU 102 may be of various types including microcontrollers and microprocessors such as programmable devices (e.g., CPLDs and FPGAs) and non-programmable devices such as gate array ASICs or general-purpose microprocessors. In the depicted embodiment, primary storage 104 acts to transfer data and instructions uni-directionally to the CPU and primary storage 106 is used typically to transfer data and instructions in a bi-directional manner. Both of these primary storage devices may include any suitable computer-readable media such as those described above. A mass storage device 108 is also coupled bi-directionally to primary storage 106 and provides additional data storage capacity and may include any of the computer-readable media described above. Mass storage device 108 may be used to store programs, data and the like and is typically a secondary storage medium such as a hard disk. Frequently, such programs, data and the like are temporarily copied to primary memory 106 for execution on CPU 102. It will be appreciated that the information retained within the mass storage device 108, may, in appropriate cases, be incorporated in standard fashion as part of primary storage 104. A specific mass storage device such as a CD-ROM 114 may also pass data uni-directionally to the CPU or primary storage.

CPU 102 is also coupled to an interface 110 that connects to one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 102 optionally may be coupled to an external device such as a database or a computer or telecommunications network using an external connection as shown generally at 112. With such a connection, it is contemplated that the CPU might receive information from the network, or might output information to the network in the course of performing the method steps described herein.

In one embodiment, a system such as computer system 100 is used as a system level simulation module generator. System 100 may also serve as various other tools associated with electronic design automation such as a synthesizer, a compiler, and a target device programmer. Information and programs, including configuration information files and other files can be provided via a network connection 112 for downloading by the designer. Alternatively, such information, programs and files can be provided to a designer on a storage device.

Figure 1B:
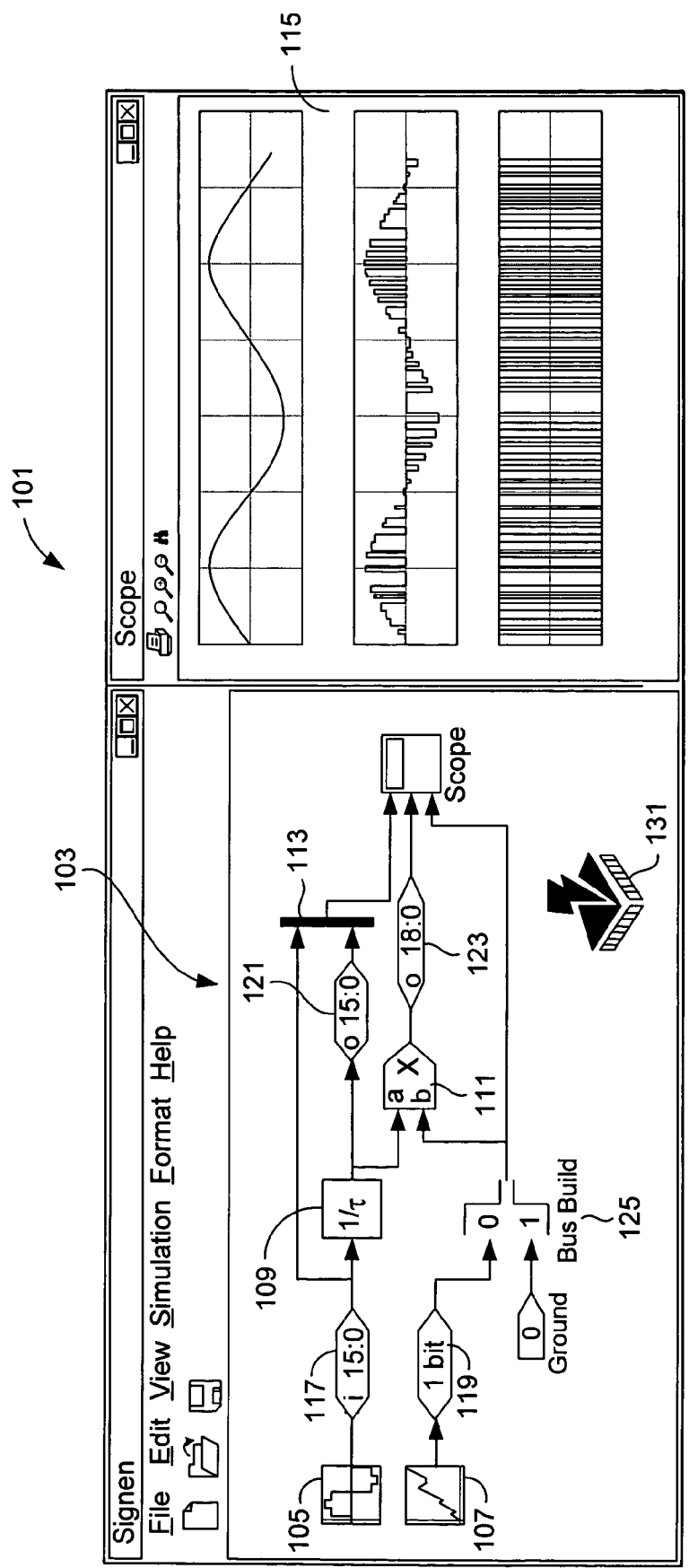
FIG. 1B presents a graphical user interface window (with a sample hardware design) for a system level simulator that makes use of the present invention.

FIG. 1B depicts an example of a hardware design entered in a system level design interface (Simulink in this example). In this simple example, the hardware design represents an amplitude modulation model. On the left hand side of a user interface window 101 (for the system level simulator) the user has input various blocks that together comprise the amplitude modulation model. A sine wave generator 105 and a random bit stream input 107 on the far left side provide the signal inputs. A delay module 109, a multiplier module 111, and a multiplexer module 113 perform the necessary signal manipulations. A scope block 115 on the right side of user interface window 101 presents simulation results for three signals of interest.

In this example, the hardware design includes four separate "word format modules" 117, 119, 121, and 123 (also identified as "AltBuses" herein) that specify a word type and a word size for certain of the signals appearing on the connections of the amplitude modulation model. These word format modules constrain the design to particular word formats, which might otherwise be represented as double precision floating point values by the system level simulator. These word format modules therefore constrain the simulator to conduct its simulation using the words specified for the hardware design. A related module, bus build module 125, constructs a bus from bit inputs: ground and a random bitstream in this case.

Figure 1C:
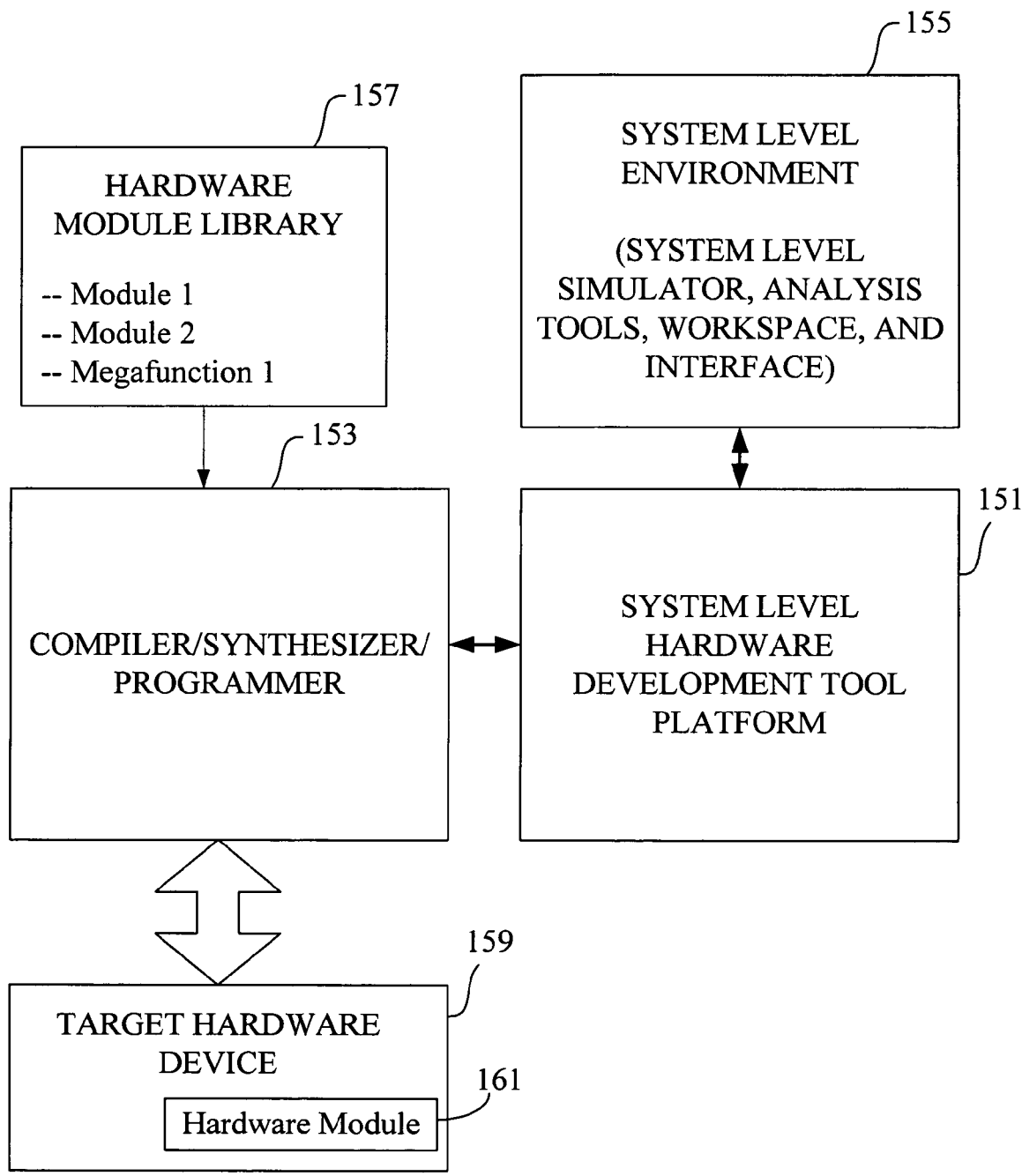
FIG. 1C is high-level block diagram of a computer system components in accordance with an embodiment of this invention.

FIG. 1C presents a high level depiction of certain software components or routines that may work together to implement the present invention. Central to the depicted arrangement is a system level hardware development platform 151. This platform links existing software components: an EDA design tool 153 and a system level environment 155. In many cases, EDA design tool 153 includes or incorporates various EDA tools such as a compiler, a synthesizer and/or a hardware programmer. As an example, Altera's Quartus® and Quartus® II design tools provide suitable compilers, and associated EDA software. The system level environment 155 typically includes a system level simulator, analysis tools, workspace, and interface. As explained, Simulink™ is a commonly used system level environment.

In this example, EDA design tools 153 support hardware design modules that include various logic functions, megafunctions, cores, megacores, etc. These may be obtained, precompiled, from a library 157 of functions or megafunctions available to the human designer. System level hardware development platform 151 makes these hardware design components available to the system level environment 155 so that users of environment 155 can enter hardware designs comprising such components. Among these components are embedded logic analyzer functions. In some embodiments, platform 151 may be integrated with environment 155 and/or compiler 153 as a single software block. In one specific example, platform 151 is a modified version of Altera's DSP Builder platform.

In operation, platform 151 communicates with environment 155 by an appropriate API. It provides additional features to the graphical user interface that is part of environment 155. Also, in response to an appropriate command, platform 151 converts the user entered hardware design to an HDL representation, and then passes that HDL representation to block 153. Block 153, in turn, compiles and the design to a programming file containing instructions for programming a blank target hardware device to implement design. This file is sometimes referred to as a "programmer object file" (or .pof file). An appropriate programming tool may then download the programming file to a target hardware device 159. As shown, hardware device 159 includes various hardware units, including a hardware unit 161, that have been programmed with hardware functions corresponding to operations of the hardware modules comprising the design.

Methodology for Generating System Level Simulation Models

The methods of this invention take a hardware module as their starting point. As explained above, a hardware module comprises an RTL representation of a hardware component such as an adder, a filter, or a processor. It is frequently found in a library of such modules available within an enterprise, over the Internet, or for license. Also as indicated above, the hardware module may be provided with a pre-mapped netlist. If it does not include a pre-mapped netlist, then one should be created prior to use with the method described in this section.

Figure 2A:
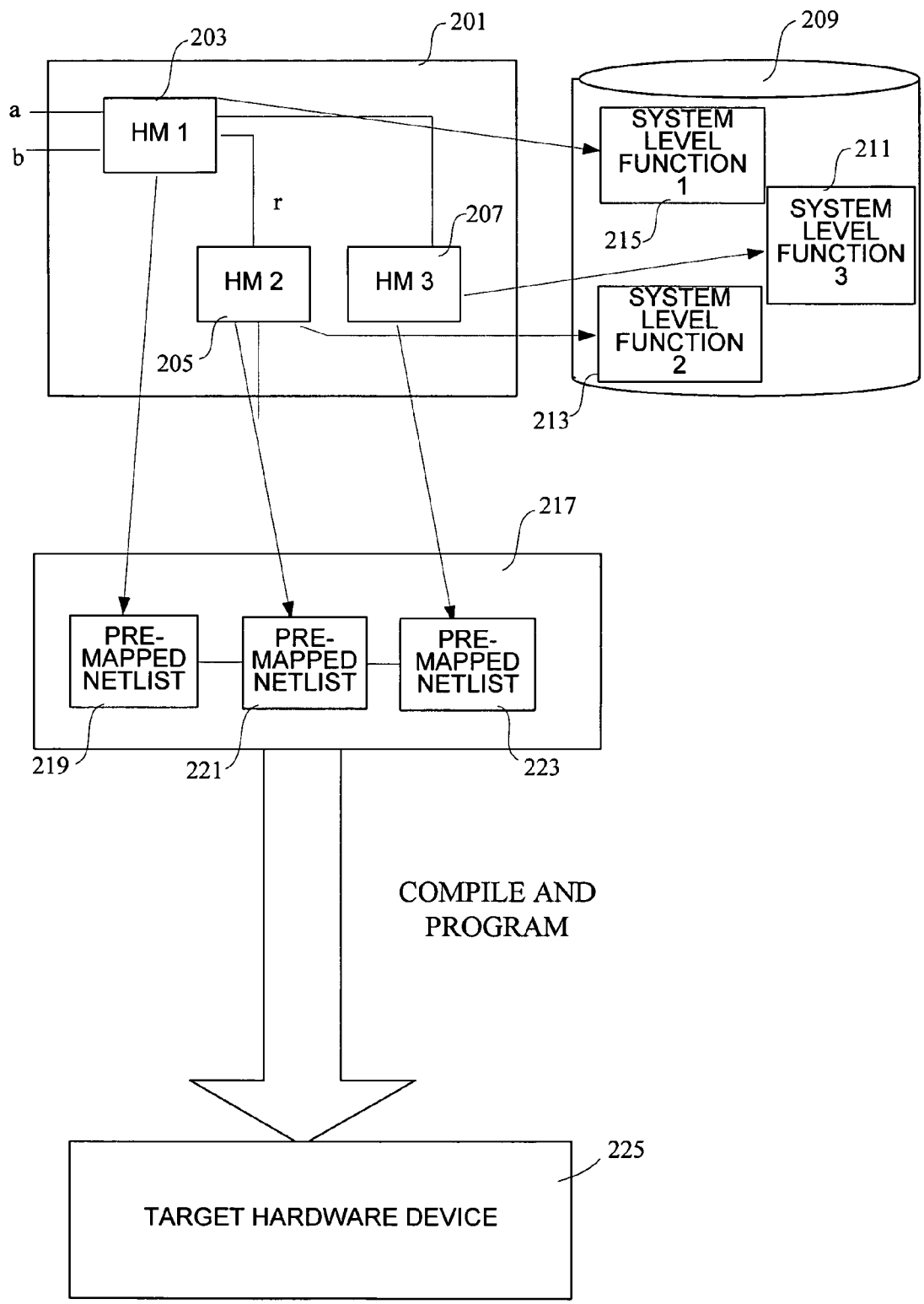
FIG. 2A is a depiction of an electronic design entered in a system level simulator as a collection of hardware modules and separately represented as a collection of functions for system level simulation and pre-mapped netlists for compilation.

As a starting point in describing the methodology of this section, FIG. 2A depicts a simple hardware design having both a functional representation for system level simulation and a corresponding RTL representation for EDA compilation and programming. In other words, FIG. 2A depicts an electronic design and the two primary ways it can be represented in accordance with this invention. As shown, a system level representation of an electronic design is depicted in a system level simulator 201. Simulator 201 displays a block or schematic diagram of various hardware modules arranged in a manner comprising the electronic design. This diagram may appear as a window on a computer screen such as window 101 depicted in FIG. 1B. The user will have typically input the modules using the user interface provided by the system level simulator. In the specific example of FIG. 2A, representation 201 has three hardware modules: a module 203, a module 205, and a module 207. Each of these separate modules is dually represented, first in a system level representation 209 and second in a mapped netlist 217.

System level representation 209 comprises a series of functions which when executed on a simulation processor perform the functions associated with corresponding hardware modules from system level simulator 201. Typically, though not necessarily, these functions are C++ objects. In the specific example of FIG. 2A, hardware module 203 is coded as function 215, hardware module 205 is coded as function 213, and hardware module 207 is coded as function 211. Collectively, these functions comprise a simulation model for the electronic design depicted in simulator 201. The system level simulator will schedule these functions for execution and then pass values from one function to the next in a manner required by the electronic design. The system level simulation process is described in more detail in the User's Guide, Version 3, Fixed-Point Blockset (for use with Simulink), available from the MathWorks.

During a normal design procedure, the user will input an initial arrangement of hardware modules in the system level simulator and then simulate their behavior. To this end, the collection of functions in the system level simulation representation 209 is executed to provide simulation results. Depending upon what these simulation results show to the user, the user will adjust his or her choice of hardware modules or the connections there between in order to improve the design. The improved design is then resimulated using an appropriately revised version of the system level simulation model 209. This process continues until the user is satisfied with the results of a particular improved design that he or she has arranged in the system level simulator 201.

The hardware development path for the electronic design represented in simulator 201 employs the complete mapped netlist 217, which includes three separate pre-mapped netlists. In this example, hardware module 203 from the system level simulator representation corresponds to an RTL mapped netlist element 219. Similarly, hardware module 205 corresponds to RTL mapped netlist element 221 and hardware module 207 corresponds to RTL mapped netlist element 223.

As explained, netlists comprise various nodes and their "nets" or connections. The nodes may be gate level components such as AND gates, multiplexers, multipliers, etc. Of relevance to this invention, these components are divided into groups (sometimes called "logic cells") that can be fit onto discrete units of a target hardware device 225. Each target device has its own hardware architecture, which is defined by discrete units such as logic elements (e.g., look up tables, SRAM blocks, product term blocks, etc.) and memory elements (e.g., RAM blocks) that can implement a defined amount of logic. Thus, the target hardware device architecture dictates the mapping of the netlist elements into logic cells.

To create a hardware design, the user may select various hardware modules such as modules 203, 205, and 207 from libraries of pre-created modules. These pre-created modules may already have mapped netlists associated therewith. As indicated, this mapping is dictated by the particular target hardware device to be programmed. Note that if any of the hardware modules in the electronic design do not have pre-created mapped netlists, the electronic design automation software can create such netlists using standard processes such as elaboration, synthesis, and mapping. Regardless of how the mapped netlists are generated for the various modules, the EDA software stitches them together to produce a complete design netlist, such as netlist 217 of FIG. 2A. Generally, the electronic design automation software takes whatever steps are necessary to generate this complete netlist, depending upon how well developed the individual hardware modules are in the current version of the design.

The mapped netlist 217 is used a starting point for "compiling" electronic design. Using netlist 217, the EDA software performs various operations such as place and route to produce a programmable representation of the current version of the design in simulator 201. A "programmer" then programs the compiled design onto the target hardware device 225. The device then has the necessary logic, memory, and registers encoded to implement the hardware design of system level simulator 201.

As discussed above, to perform the system level simulation, one must obtain system level simulation modules corresponding to the individual hardware modules employed in the system level design. Specifically, in FIG. 2A, one must obtain system level functions 215, 213, and 211 representing hardware modules 201, 205, and 207.

Figure 2B:
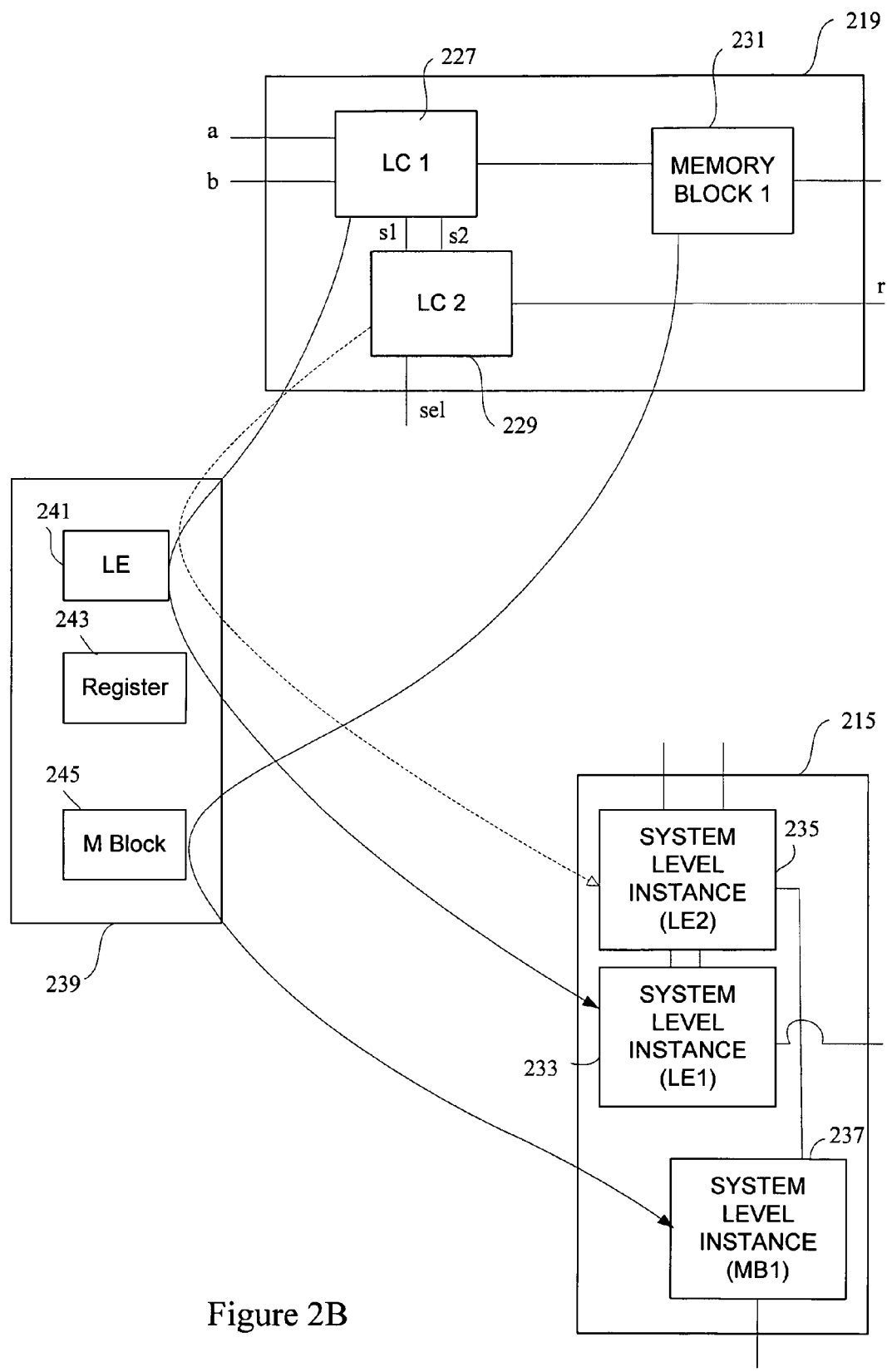
FIG. 2B is a depiction of a hardware module pre-mapped netlist comprised of logic elements and a memory block and corresponding system level instances used for performing a system level simulation of the hardware module.

A process for generating simulation modules is schematically depicted in FIG. 2B. As shown there, the RTL mapped netlist representation 219 of a hardware module is used as the basis for generating the system level simulation model 215. In this example, mapped netlist 219 includes two logic cells (logic cell 227 and logic cell 229) and a memory block 231. In other words, the various gates, memory, and other hardware features that make up hardware module 219 are mapped into two separate logic cells and a memory cell. The number of gates and other hardware features that can be fit into logic cells 227 and 229 is determined by the characteristics of logic elements in the target hardware device. Similarly, the amount of memory that can be fit into a memory cell 231 is determined by the characteristics of memory elements in target hardware device 225. Understand that different target devices may have logic elements and memory elements with different capacities to implement logic and memory.

Each of logic cells 227 and 229 and memory cell 231 are examples of "hardware cells" that comprise the pre-mapped netlist 219. These have corresponding system level instances 233 (corresponding to logic cell 227), 235 (corresponding to logic cell 229), and 237 (corresponding to memory cell 231).

To create the system level instances from the hardware cells, generic "system level units" 239 are employed. Typically, these are C++ classes. They are instantiated with appropriate parameter values obtained from the hardware cells in order to create the individual system level instances corresponding to the individual hardware cells. As depicted in FIG. 2B, one fundamental system level unit may be provided for each type of fundamental architectural element on the target hardware device. Specifically, as depicted, there is a logic element unit 241, a register element 243, and a memory block element 245. As depicted, system level instances 233 and 235 are instantiated from logic element unit 241. System level instance 237, in contrast, is instantiated from memory block class 245.

Figure 2C:
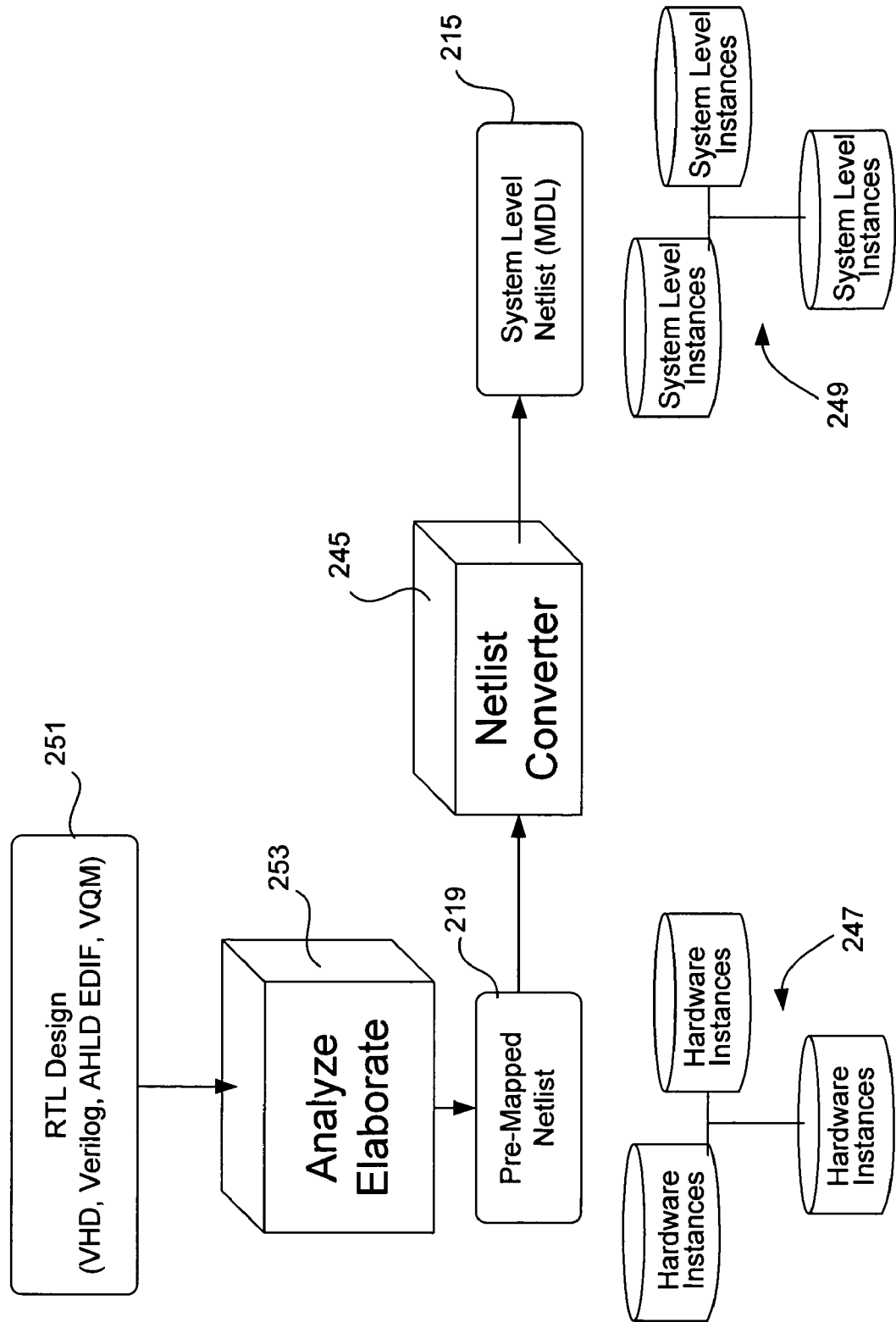
FIG. 2C is a depiction of a netlist converter for converting a pre-mapped netlist of hardware cells to a system level netlist of system level instances for performing a system level simulation.

FIG. 2C depicts the conversion process from the perspective of a netlist converter 245, which converts the hardware cells 245 of pre-mapped netlist 219 (for hardware module 203) to system level instances 249 of system level netlist 215 (for the hardware module 203). Netlist converter 245 is generally software or some combination of software and hardware for creating system level instances such as instances 249 from an appropriate hardware representation of the hardware module under consideration. In the context of FIG. 1C, it preferably exists as part of the system level hardware development platform 151.

As illustrated in FIG. 2C, the pre-mapped netlist 219 may be obtained from an RTL representation of the hardware module 251 that has been analyzed and elaborated by a tool 253. Tool 253 may be any suitable tool for converting a hardware design language representation of a hardware module to a netlist and ultimately a netlist mapped to corresponding logic cells, memory blocks, registers, and/or any other fundamental architectural unit of the target hardware device. In the context of FIG. 1C, it preferably exists as part of the EDA design tool 153. Examples of suitable tools include Altera's Quartus® and Quartus® II design tools.

Figure 3:
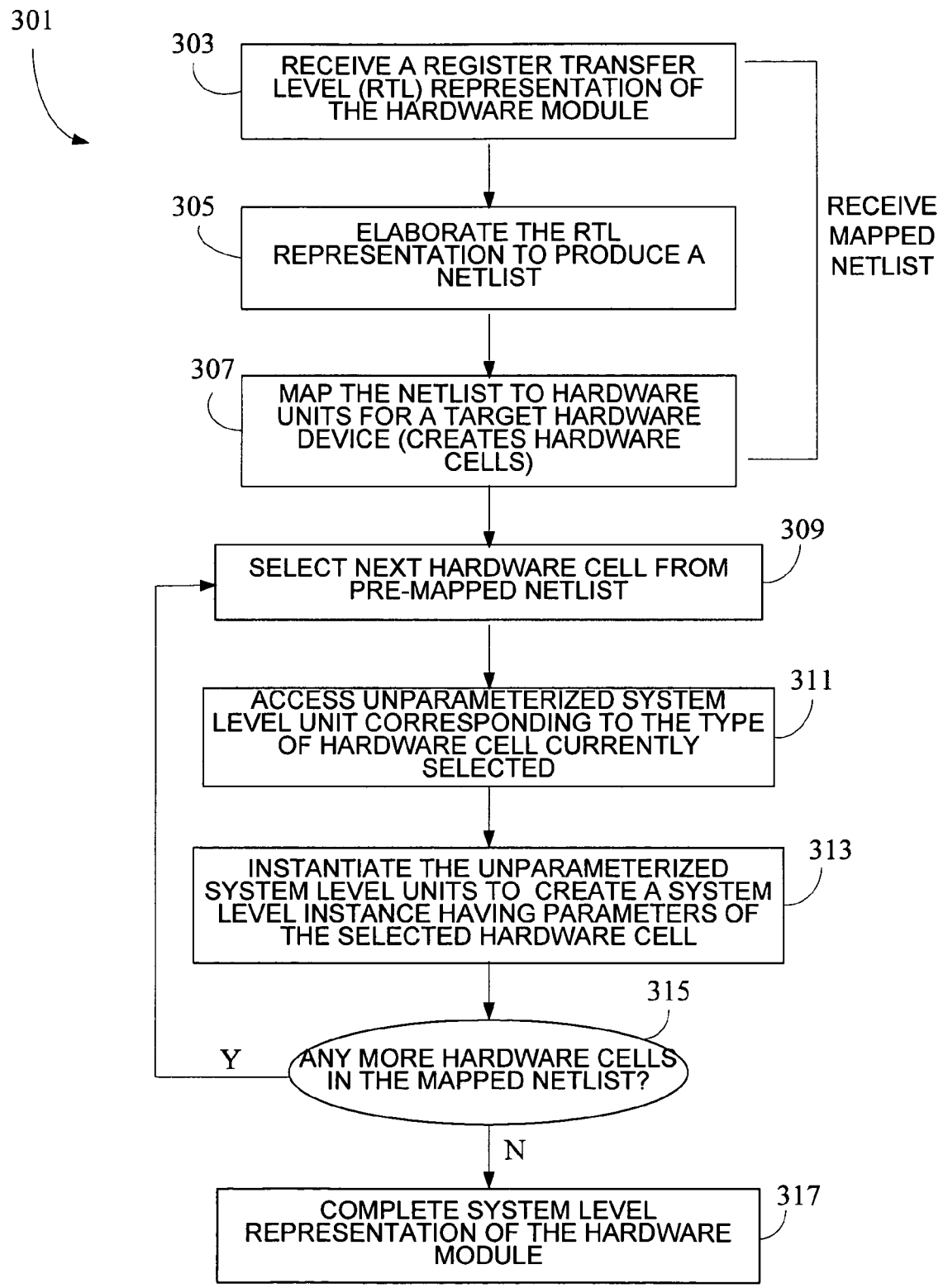
FIG. 3 is a process flow diagram depicting a procedure for generating a system level simulation model in accordance with an embodiment of this invention.

FIG. 3 presents a process flow diagram depicting a sequence of operations for generating a system level netlist for a single hardware module, in accordance with one embodiment of this invention. As show, a process 301 begins at 303 with receipt of an RTL representation of the hardware module under consideration. As indicated, an RTL representation is a logical representation of the hardware module written in appropriate hardware design language such as VHDL, Verilog, AHDL (Altera Corporation's Hardware design language), EDIF, VQM, and the like.

Next in the sequence, process 301 analyzes and elaborates the RTL representation as necessary to produce a netlist 305. Thereafter, the netlist for the hardware module is mapped to hardware units for the target hardware device under consideration. See process block 307. This operation creates the various hardware cells that comprise the pre-mapped netlist.

In some cases, the hardware module in question will be provided with a pre-mapped netlist. As indicated, it is common for libraries to provide hardware modules with pre-mapped netlists. In such cases, operations 303 through 307 are essentially condensed into a single process operation "receive a pre-mapped netlist." To this end, the netlist converter logic responsible for executing operations 303 through 307 will distinguish those hardware modules containing pre-mapped netlists from those that do not.

With the pre-mapped netlist now available, the process selects a first hardware cell from the mapped netlist. See operation 309. In many embodiments, the various hardware cells may be processed in any order. Essentially, the process considers each hardware cell in turn until all hardware cells in the pre-mapped netlist have been converted to system level instances to create a complete system level netlist.

With the current hardware cell available for consideration, the process accesses an un-parameterized system level unit corresponding to the type of hardware unit currently selected. See block 311. The un-parameterized system level unit may be one of the units 241, 243, and 245 as illustrated in FIG. 2B. As indicated, these units may be uninstantiated object classes. Regardless of there actual form, the unit is selected to match the particular type of hardware cell under consideration; e.g., a logic element versus a memory block versus a register.

With the parameters from the current hardware cell and the correct un-parameterized system level unit in hand, the process next instantiates the system level unit to create the corresponding system level instance having the parameters of the selected hardware cell. See process block 313.

If there are more hardware cells to consider in the mapped netlist, a decision 315 directs process control back to process block 309 where a next hardware cell is selected from the pre-mapped netlist. After each hardware cell from the pre-mapped netlist is, in turn, converted to a corresponding system level instance, the system level netlist is complete and decision 315 is answered in the negative. At that point, the process completes the system level representation of the hardware module. See process block 317. This completes the system level representation. In some cases, however, it may be necessary to set particular initial conditions for the simulation model. These include, for example, particular register values and/or particular memory contents.

The individual operations of process 301 will now be described in some more detail. At 301, the system level hardware development platform receives a register transfer level (RTL) representation of the hardware module. As indicated, an RTL representation generally presents the hardware function in a Boolean or logical format that is independent of any particular hardware implementation. For example, an RTL function such as result<=(a and b) when select "1" else (a or b)

could be implemented in various arrangements of hardware gates, although the typical case would be a multiplexer with one input fed from an "a" AND "b" gate and another input fed from an "a" OR "b" gate.

Note that during the normal electronic design automation (EDA) flow, an RTL level representation is needed to implement a hardware design on a target hardware device. A typical process flow for EDA involves converting the RTL representation to a netlist, synthesizing the netlist, mapping the netlist to hardware units defined for the target hardware device to create hardware cells (e.g., specific logic cells, memory cells, and registers implementing portions of the netlist), placing the hardware cells on particular hardware units located at specific positions on the target hardware device (e.g., specific logic elements and memory blocks), routing interconnections between the placed hardware cells to produce a compiled electronic design, and programming the target hardware device with the compiled electronic design. This basic EDA flow and numerous variations on it are known to those of skill in the art.

Most hardware modules available from vendors, public libraries, and in house libraries have at least RTL representations. The hardware modules may also have lower level representations such as mapped netlists corresponding the RTL representations. Often they are parameterizable by the user. What these modules typically lack, as indicated above, is a system level representation such as a C++ representation.

At operation 305, the system level hardware development platform elaborates the RTL representation to produce a netlist. As explained, a netlist generally comprises "nodes" connected to one another by "nets." The nodes represent basic logic or memory blocks that perform particular functions. Examples include gate level functions such as AND, XOR, MULTIPLY, and the like. Higher-level node functions such as flip-flops are possible. Some other examples from a library of parameterizable modules (LPM) include accumulators, CAMs, multiplier-adders, comparators, FIFOs, counters, latches, RAM blocks, and shift registers. The nets show the signal paths between node outputs and node inputs. Elaborating is a well known procedure for converting the Boolean RTL representations to netlists. In some embodiments, the netlist may be separately synthesized to remove redundancy, etc.

At operation 307, the system level hardware development platform maps the netlist to hardware units for a target hardware device. As indicated above, this procedure generates hardware cells that specify one or more hardware functions corresponding to the nodes of the netlist. The mapping procedure groups or associates individual nodes and nets from the netlist with one another to create hardware cells. Each hardware cell contains no more logic and/or memory than can fit within (or be implemented on) a single hardware unit of the target hardware device.

A hardware unit is the basic element of hardware on a target hardware device. Examples include logic elements and memory blocks. Some logic elements may include registers. Others may include DSP features (e.g., multipliers-accumulators). In Altera's Stratix™ products, the hardware units include (a) logic elements comprised of a four-input look up table (LUT), which is a function generator that can implement any function of four variables, and a programmable register and carry chain with carry select capability and (b) memory blocks comprised of RAM with dual-port memory and first-in first-out (FIFO) buffers. Other details of the Stratix product and other Altera hardware devices can be found in the appropriate data sheets at www.altera.com.

Each hardware cell specifies the functions and connections for its portion of the netlist. Together the hardware cells for the hardware module define a mapped netlist. This is essentially the netlist generated at operation 305 above, but with the logic nodes and nets grouped in "boxes" (hardware cells) that contain no more hardware than can be implemented in a single hardware unit.

Note that to the extent that a hardware module is provided with a netlist or a mapped netlist, operations 305 and 307 are not necessary for the present invention. So, depending on the state of the hardware module, operations 305 and 307 are optional. At the other extreme, it may be necessary for a user to generate a hardware module from scratch, in which case she must create her own RTL representation. In such case, "receiving the RTL representation" of operation 303 is effectively a create RTL representation operation.

At 311, the system level hardware development platform accesses "un-parameterized system level units" corresponding to the hardware units of the target hardware device. As explained herein, this invention provides "objects" representing un-programmed hardware units (logic elements, memory blocks, etc. of the target hardware device). These are the un-parameterized system level units designed to correspond to the available logic, memory, or registers on corresponding hardware units of the target hardware device. In other words, these represent generic logic elements, memory blocks, and registers for the target hardware device. The generic logic elements may be of different types; e.g., one that includes registers, another that includes DSP functionality, etc. In one embodiment, the invention provides a single un-parameterized system level logic element, a single un-parameterized system level memory block, and an un-parameterized system level register for a given target hardware device. In some cases, the un-parameterized elements will be specific for particular families of hardware devices (e.g., some elements are specific for Stratix™ devices while others are specific for Flex™ devices).

The un-parameterized system level units are frequently C++ objects that can be instantiated with parameters and ports to create system level instances. But prior to instantiation, they represent nothing more than generic un-programmed logic elements, memory block, and register elements.

At 313, the system level hardware development platform instantiates the un-parameterized system level units to create system level instances. This operation parameterizes or instantiates the system level units to create system level instances. Each system level instance is program code (e.g., C++ code) for performing the hardware functions of a corresponding hardware cell. In other words, each hardware cell has a corresponding system level instance, with the two instances representing the same function. The system level instances are generated from the generic un-parameterized system level units during operation 313.

During operation 313, the system level units are instantiated with parameters, ports, and other attributes that allow them to perform the functions of the corresponding hardware cells when executed. As an example, a simple hardware cell for a multiplexer with one input fed from an a AND b gate and another input fed from an a OR b gate could be provided in RTL as result <=(a and b) when select="1" else (a or b).

The corresponding system level instance could be provided in C as result=(sel? a&b:a||b).

Note that the hardware cells are part of a mapped netlist and the system level instances are part of a "system level netlist." In other words, the collection of system level instances comprises a system level netlist for the hardware module in question.

Finally, the system level hardware development platform compiles and executes the system level netlist to perform a system level simulation of the hardware module. This operation may be performed alone for the hardware module in question, or more typically in conjunction with simulations of other hardware modules that together comprise an entire electronic design created by a user in a system level simulator.

Figure 4A:
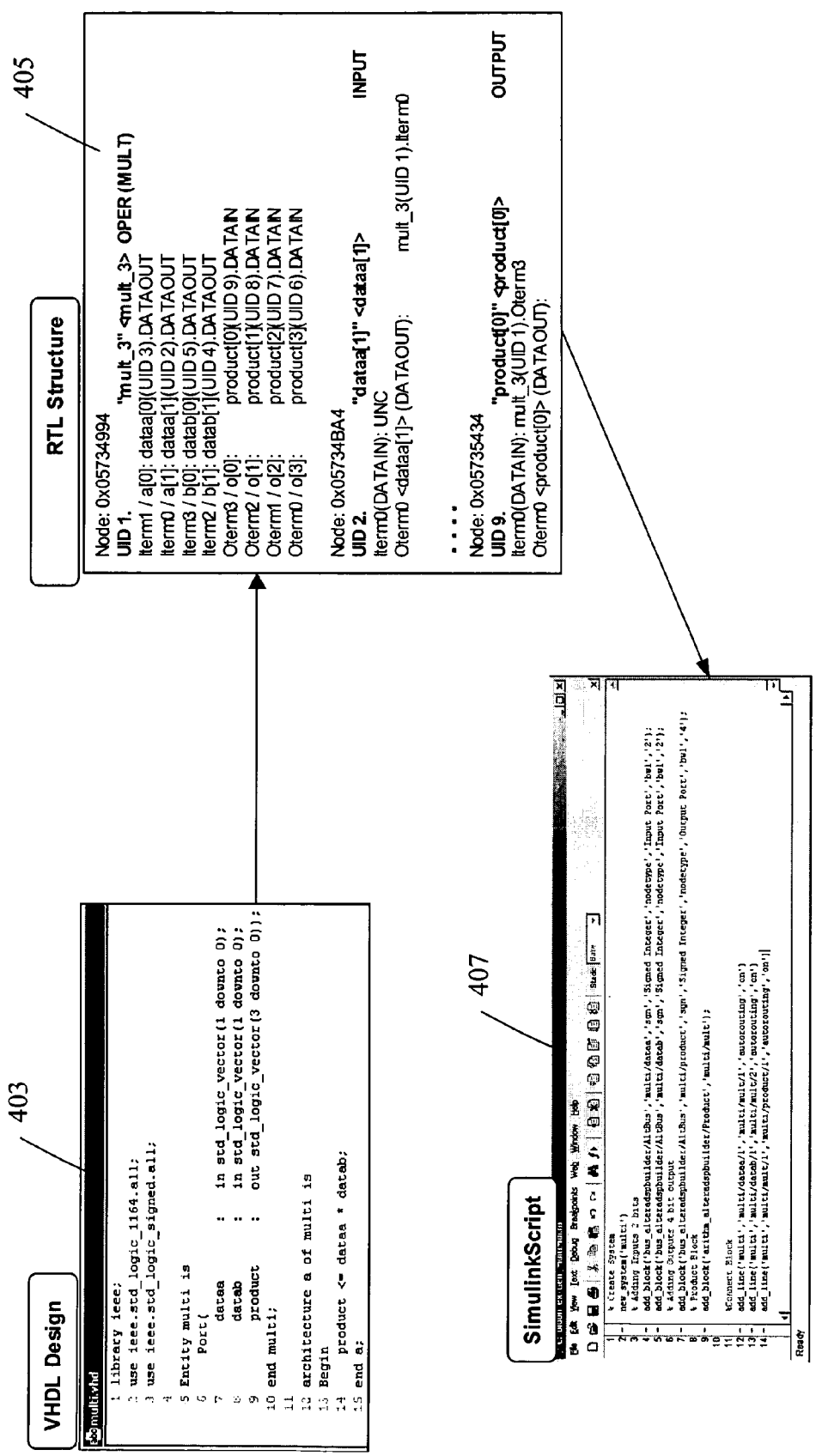
FIG. 4A is a schematic depiction of the process of converting VHDL to RTL and ultimately system level script for system level simulation.

FIG. 4A is a schematic depiction of the process of converting VHDL to RTL and ultimately system level script for system level simulation. In this figure, a VHDL representation of a multiplier 403 corresponds to an RTL representation of the structure 405 as shown. VHDL and RTL representations 403 and 405 may be provided together as part of a library. Or alternatively a compiler or other design tool generates the RTL representation from the VHDL representation by elaboration. The RTL representation 405 comprises an unmapped netlist. In accordance with this invention, the RTL structure is converted to system level code 407 for performing a system level simulation of the multiplier function. This may be accomplished by mapping RTL structure representation 405 and then instantiating the un-parameterized logic elements to C++ system level instances corresponding mapped logic elements.

Figure 4B:
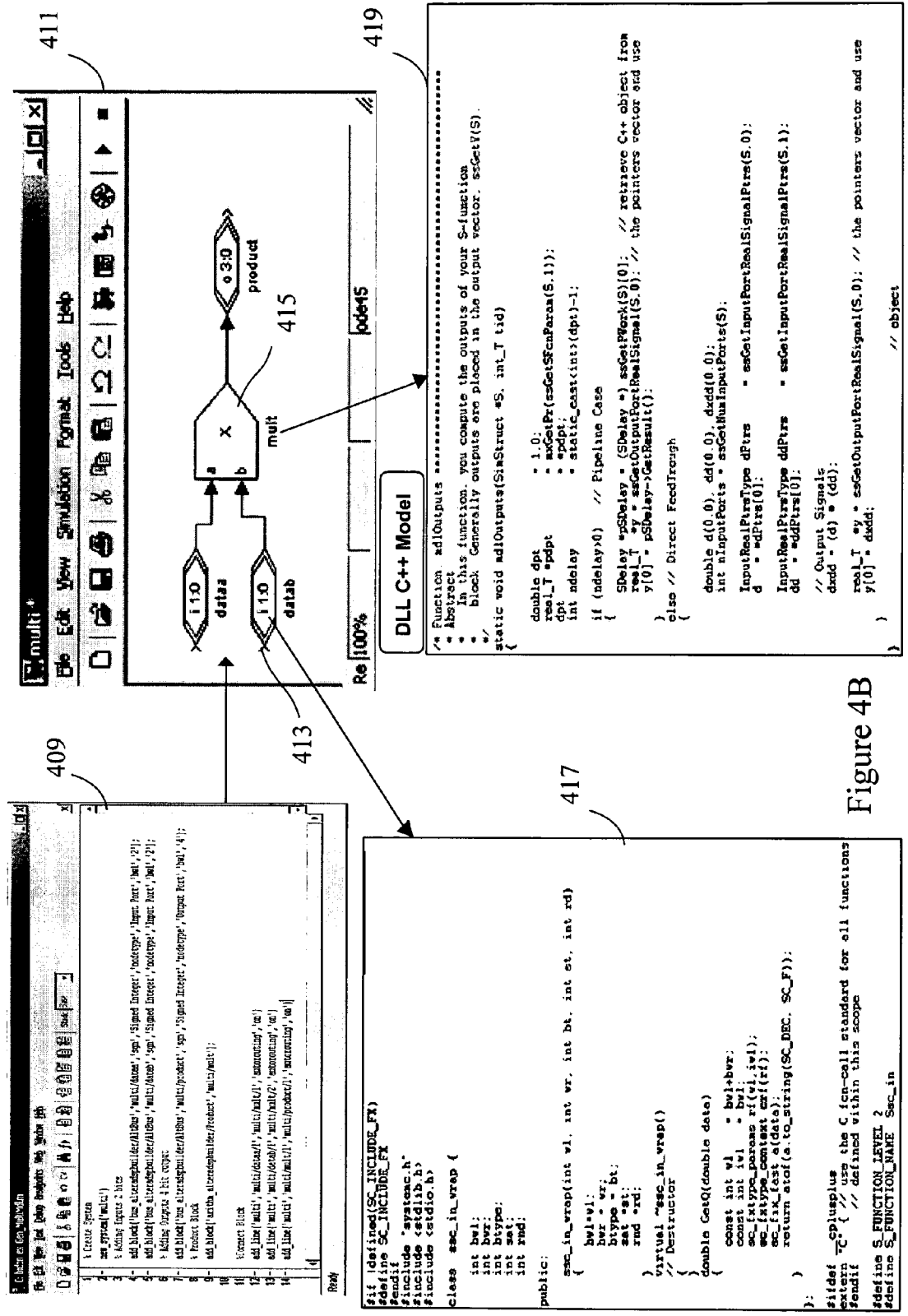
FIG. 4B is a depiction of an .md1 system level representation of a simple hardware design together with the C++ code for system level simulation of two hardware blocks from the hardware design, as generated in accordance with embodiment of this invention.

FIG. 4B shows Simulink constructor script 409 for the I/O and multiplier functionality shown in window 411. The schematic shown in window 411 may be generated by executing script 409 in a MatLab environment. Instantiated C++ blocks for a "datab" input 413 and a multiplier 415 are shown in blocks 417 and 419, respectively. In accordance with an embodiment of this invention, C++ modules 417 and 419 can be generated from an RTL representation of the structure shown in window 411. This is accomplished by instantiating un-parameterized logic elements with parameters specified for input 413 and multiplier 415.

OTHER EMBODIMENTS

While the methods, apparatus, and computer program products of this invention are applicable to any electronic design, they find particular value in the context of programmable logic devices (PLDs). A PLD is a programmable integrated circuit that allows the user of the circuit, using software control, to customize the logic functions the circuit will perform. Examples of PLDs are FPGAs (Field Programmable Gate Arrays) and EPLDs (Erasable Programmable Logic Devices). The logic functions previously performed by small, medium and large-scale integration integrated circuits can instead be performed by programmable logic devices. Programmable logic devices supplied by integrated circuit manufacturers like Altera Corporation (a more detailed description of these products can be found at "www.altera.com") are not inherently capable of performing any specific function. The user, in conjunction with software supplied by the PLD manufacturer, can program the PLD to perform the specific function or functions required by the user's application. The PLD then can function in a larger system designed by the user, just as though dedicated logic chips were employed.

A typical PLD includes an array of logic cells that can be individually programmed and arbitrarily interconnected to each other to provide internal input and output signals, thus permitting the performance of complex combinational and sequential logic functions. The program is implemented in the PLD by setting the states of programmable elements such as memory cells. These memory cells may be implemented with volatile memories, such as SRAMs, which lose their programmed states upon termination of power to the system. If the programmable elements used are volatile memories, the memory cells must be configured upon each system power-up in order to configure the PLD.

In addition to methods, apparatus, and computer program products, this invention also relates to programmable logic devices (and other target hardware devices) programmed with a design prepared in accordance with the above-described methods.

The foregoing describes the instant invention and its presently preferred embodiments. Numerous modifications and variations in the practice of this invention are expected to occur to those skilled in the art. For instance, the techniques and systems of the present invention are suitable for use with a wide variety of EDA tools and methodologies for designing, simulating, compiling and/or programming a device. Therefore, the described embodiments should be taken as illustrative and not restrictive, and the invention should not be limited to the details given herein but should be defined by the following claims and their full scope of equivalents.

What is claimed is:

1. A method of automatically generating a system level representation of a hardware module suitable for execution in a system-level simulator, the method comprising:
    (a) receiving a mapped netlist of a hardware module which mapped netlist comprises hardware cells, each specifying one or more hardware functions to be implemented on a corresponding hardware unit of a target hardware device, the hardware cells collectively comprising a mapped netlist;
    (b) accessing one or more un-parameterized system level units, each system level unit being a software class that represents generically one of said corresponding hardware units of the target hardware device;

(c) instantiating the un-parameterized system level units to create system level instances, each programmed to perform the hardware functions of one of said hardware cells, each system-level instance being a software object that is coded in a general-purpose language;

(d) creating a hardware implementation-independent system level netlist based on the mapped netlist using said system level instances, said system level netlist being distinct from said mapped netlist; and (e) compiling the system level netlist to produce an executable version of the system level representation, said executable version being simulation code suitable for execution in a system-level simulator; wherein the steps a-e is performed using one or more processor.

2. The method of claim 1, further comprising:
performing a system level simulation on the hardware module by executing the executable version of the system level representation in a system-level simulator.

3. The method of claim 1, wherein the hardware units correspond to one or more of logic elements, memory elements, and register elements provided on the target hardware device.

4. The method of claim 1, wherein the un-parameterized system level units are C++ classes.

5. The method of claim 1, wherein instantiating the un-parameterized system level units comprises specifying ports and logical functions for the un-parameterized system level units.

6. A computer program product comprising a machine storage medium on which is provided program instructions for automatically generating a system level representation of a hardware module, when executed by a processor performs the steps of:

(a) receiving a mapped netlist of a hardware module which mapped netlist comprises hardware cells, each specifying one or more hardware functions to be implemented on a corresponding hardware unit of a target hardware device, the hardware cells collectively comprising a mapped netlist;

(b) accessing one or more un-parameterized system level units, each system level unit being a software class that represents generically one of said corresponding hardware units of the target hardware device;

(c) instantiating the un-parameterized system level units to create system level instances, each programmed to perform the hardware functions of one of said hardware cells, each system-level instance being a software object that is coded in a general-purpose language;

(d) creating a hardware implementation-independent system level netlist based on the mapped netlist using said system level instances, said system level netlist being distinct from said mapped netlist; and (e) compiling the system level netlist to produce an executable version of the system level representation, said executable version being simulation code suitable for execution in a system-level simulator.

7. The computer program product of claim 6, further comprising code for performing a system level simulation on the hardware module by executing the system level representation.

8. The computer program product of claim 6, wherein the hardware units correspond to one or more of logic elements, memory elements, and register elements provided on the target hardware device.

9. The computer program product of claim 6, wherein the un-parameterized system level units are C++ classes.

10. The computer program product of claim 6, wherein the code for instantiating the un-parameterized system level units comprises code for specifying ports and logical functions for the un-parameterized system level units.

11. An apparatus for automatically generating a system level representation of a hardware module, the apparatus comprising:
memory;
one or more processors;
an electronic design automation tool embodied in said memory for compiling RTL representations of electronic designs comprising hardware modules;
a system level environment embodied in said memory for entering electronic designs and performing system level simulations of said electronic designs; and
a system level hardware development tool platform embodied in said memory for generating system level representations of the hardware modules, which system level representations can be executed in a system level simulation to simulate the behavior of the hardware modules,
wherein said system level hardware development tool platform generates the system level representations from mapped netlists of hardware modules which mapped netlists comprise hardware cells, each hardware cell specifying one or more hardware functions to be implemented on a corresponding hardware unit of a target hardware device, the hardware cells collectively defining one of said mapped netlists; and
wherein said system level hardware development tool platform generates the system level representations from mapped netlists of hardware modules by
(i) accessing one or more un-parameterized system level units, each system level unit being a software class that represents generically one of said corresponding hardware units of the target hardware device,
(ii) instantiating the un-parameterized system level units to create system level instances, each programmed to perform the hardware functions of one of said hardware cells, each system-level instance being a software object that is coded in a general-purpose language,
(iii) creating a hardware implementation-independent system level netlist based on the mapped netlist using said system level instances, said system level netlist being distinct from said mapped netlist, said system level netlist being embodied in said memory, and
(iv) compiling the system-level netlist to produce executable simulation code suitable for execution in a system-level simulator.

12. The apparatus of claim 11, wherein the electronic design automation tool comprises logic for synthesizing said electronic designs.

13. The apparatus of claim 11, wherein the electronic design automation tool comprises logic for programming said electronic designs onto target hardware devices.

14. The apparatus of claim 11, wherein the hardware units correspond to one or more of logic elements, memory elements, and register elements provided on the target hardware device.

15. The apparatus of claim 11, wherein the un-parameterized system level units are C++ classes.

16. The apparatus of claim 11, wherein the system level hardware development tool platform instantiates the un-parameterized system level units by specifying ports and logical functions for the un-parameterized system level units.

17. A method of automatically generating a system level representation of a hardware module, the method comprising:
- (a) receiving a mapped netlist for a register transfer level (RTL) representation of the hardware module, which mapped netlist comprises hardware cells corresponding to programmed hardware units of a target hardware device;
- (b) converting said mapped netlist to a hardware implementation-independent system level netlist comprising system level instances corresponding to the hardware cells, each system-level instance being a software object that is coded in a general-purpose language, wherein the system level netlist is based on the mapped netlist, said system level netlist being distinct from said mapped netlist; and
- (c) compiling the system level netlist to produce an executable version of the system level representation, said executable version being simulation code suitable for execution in a system-level simulator; wherein the steps a-c is performed using a processor.

18. A method of automatically generating a system level representation of a hardware module, the method comprising:
- (a) receiving a register transfer level (RTL) representation of the hardware module;
- (b) elaborating the RTL representation to produce a netlist;
- (c) mapping the netlist to hardware units of a target hardware device, on which the hardware module may be programmed, to create hardware cells, each hardware cell specifying one or more hardware functions to be implemented on a corresponding hardware unit, the hardware cells collectively comprising a mapped netlist;
- (d) accessing one or more un-parameterized system level units, each system level unit being a software class that represents generically one of said corresponding hardware units of the target hardware device;
- (e) instantiating the un-parameterized system level units to create system level instances, each programmed to perform the hardware functions one of said hardware cells, each system-level instance being a software object that is coded in a general-purpose language;
- (f) creating a hardware implementation-independent system level netlist based on the mapped netlist using said system level instances, said system level netlist being distinct from said mapped netlist; and
- (g) compiling the system level netlist to produce an executable version of the system level representation, said executable version being simulation code suitable for execution in a system-level simulator; wherein the steps a-g is performed using a processor.

19. The method of claim 18, further comprising synthesizing the netlist produced from the RTL representation.

20. The method of claim 18, wherein the RTL representation of the hardware module comprises hardware design language code.

21. An apparatus for automatically generating a system level representation of a hardware module, the apparatus comprising:
- (a) means for receiving a register transfer level (RTL) representation of the hardware module;
- (b) means for elaborating the RTL representation to produce a netlist;
- (c) means for mapping the netlist to hardware units of a target hardware device, on which the hardware module may be programmed, to create hardware cells, each specifying one or more hardware functions to be implemented on a corresponding hardware unit, the hardware cells collectively comprising a mapped netlist;
- (d) means for accessing one or more un-parameterized system level units, each system level unit being a software class that represents generically one of said corresponding hardware units of the target hardware device;
- (e) means for instantiating the un-parameterized system level units to create system level instances, each programmed to perform the hardware functions of one of said hardware cells, each system-level instance being a software object that is coded in a general-purpose language;
- (f) means for creating a hardware implementation-independent system level netlist based on the mapped netlist using said system level instances, said system level netlist being distinct from said mapped netlist, said system level netlist being embodied in memory of said apparatus; and
- (g) means for compiling the system-level netlist to produce executable simulation code suitable for execution in a system-level simulator.

22. A method as recited in claim 1 further comprising:
automatically creating said system level instances from said hardware cells of said mapped netlist using a netlist converter.

* * * * *